(12) United States Patent
Woo et al.

(10) Patent No.: US 6,989,604 B1
(45) Date of Patent: Jan. 24, 2006

(54) CONFORMAL BARRIER LINER IN AN INTEGRATED CIRCUIT INTERCONNECT

(75) Inventors: Christy Mei-Chu Woo, Cupertino, CA (US); Minh Van Ngo, Fremont, CA (US); John E. Sanchez, Jr., Palo Alto, CA (US); Steven C. Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 10/672,103

(22) Filed: Sep. 26, 2003

Related U.S. Application Data

(62) Division of application No. 10/165,510, filed on Jun. 6, 2002, now Pat. No. 6,657,304.

(51) Int. Cl.
*H01L 23/52* (2006.01)
(52) U.S. Cl. .................. 257/774; 257/750
(58) Field of Classification Search ......... 257/750–776
See application file for complete search history.

(56) References Cited

U.S. PATENT DOCUMENTS

| | | | | |
|---|---|---|---|---|
| 5,904,565 | A | * | 5/1999 | Nguyen et al. ............ 438/687 |
| 6,040,243 | A | * | 3/2000 | Li et al. .................... 438/687 |
| 6,239,021 | B1 | * | 5/2001 | Pramanick et al. ........ 438/627 |
| 6,300,236 | B1 | * | 10/2001 | Harper et al. .............. 438/618 |
| 6,455,417 | B1 | * | 9/2002 | Bao et al. .................. 438/637 |
| 6,486,059 | B2 | * | 11/2002 | Lee et al. .................. 438/637 |

* cited by examiner

*Primary Examiner*—Leonardo Andújar
(74) *Attorney, Agent, or Firm*—Mikio Ishimaru

(57) ABSTRACT

An integrated circuit having a substrate and a semiconductor device thereon. A stop layer over the substrate has a first dielectric layer formed thereon having an opening into which a first conformal barrier is formed. A first conformal barrier liner is formed in the opening, processed, and treated to improve adhesion. Portions of the first conformal barrier liner on the sidewalls act as a barrier to diffusion of conductor core material to the first dielectric layer. A conductor material is formed in the opening over the vertical portions of the first conformal barrier liner and the first stop layer.

14 Claims, 5 Drawing Sheets

CONFORMAL BARRIER LINER IN AN INTEGRATED CIRCUIT INTERCONNECT

CROSS-REFERENCE TO RELATED APPLICATION

This is a Divisional of application Ser. No. 10/165,510 filed Jun. 6, 2002 now U.S. Pat. No. 6,657,304.

The present application contains subject matter related to copending U.S. patent application Ser. No. 10/079,515 by Christy Mei-Chu Woo, John E. Sanchez, Darrell M. Erb, and Amit P. Marathe entitled "COPPER INTERCONNECT WITH IMPROVED BARRIER LAYER". The related application is assigned to Advanced Micro Devices, Inc.

TECHNICAL FIELD

The present invention relates generally to semiconductor technology and more particularly to an integrated circuit interconnect.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two interconnect channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. An abrasiveless chemical is used for the chemical-mechanical polishing process in order to prevent abrasives from being left in the channel. When a layer is placed over the first channels as a final layer, it is called a "capping" layer and a "single" damascene process is completed. When the layer is processed further for placement of additional channels over it, the layer is a via stop layer.

The via formation step of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "capping" layer and the "dual" damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A major problem with using copper in the conductor core is that copper tends to migrate into the dielectric layer in a process known as diffusion. The migration of copper atoms can lead to electrical short circuits, rendering the circuit unusable. Barrier layers deposited by self-ionized plasma (SIP) deposition have traditionally had high barrier resistance to limit the diffusion of copper atoms, but as the dimensions of semiconductor devices shrink in the quest to improve chip performance, the proportional scaling of barrier layer dimensions in vias leads to extremely thin (10–20 angstroms) via sidewalls.

In addition, the size reductions have caused the channels to be closer together which requires the use of low dielectric constant (low-k) dielectric materials having dielectric constants under 3.9. These dielectric materials are porous and, where the barrier depositions were formerly conformal to the conventional dielectric constant dielectric materials, the barrier layers are no longer conformal to these materials. In addition, these depositions have been found to damage the dielectric materials as well as causing poor adhesion to seed layers.

Both the thinness of the barrier layer, and its now non-conformal characteristic, has led to its ineffectiveness as a diffusion barrier and also to the formation of voids in the associated seed layer and conductor core leading to reductions in electromigration (EM) resistance.

Diffusion relates to the movement of copper atoms from the conductor core into the dielectric layer, causing short circuits and EM relates to the movement of copper atoms under influence of current, particularly at the interface between layers or areas of poor adhesion, which form voids that can lead to an open circuit in the via.

While the problems have been well known and many attempts have been made to solve individual problems, a solution that would solve all the problems has long been sought by those skilled in the art.

DISCLOSURE OF THE INVENTION

The present invention provides an integrated circuit having a substrate and a semiconductor device thereon. A stop layer over the substrate has a dielectric layer formed thereon having an opening into which a conformal barrier is formed. A conformal barrier liner is formed in the opening, processed, and treated to improve adhesion. Portions of the conformal barrier liner on the sidewalls act as a barrier to diffusion of conductor core material to the dielectric layer. A conductor material in the opening over the vertical portions of the conformal barrier liner and the stop layer complete the conductor core. The integrated circuit has reduced size and good barrier resistance to electro-migration.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
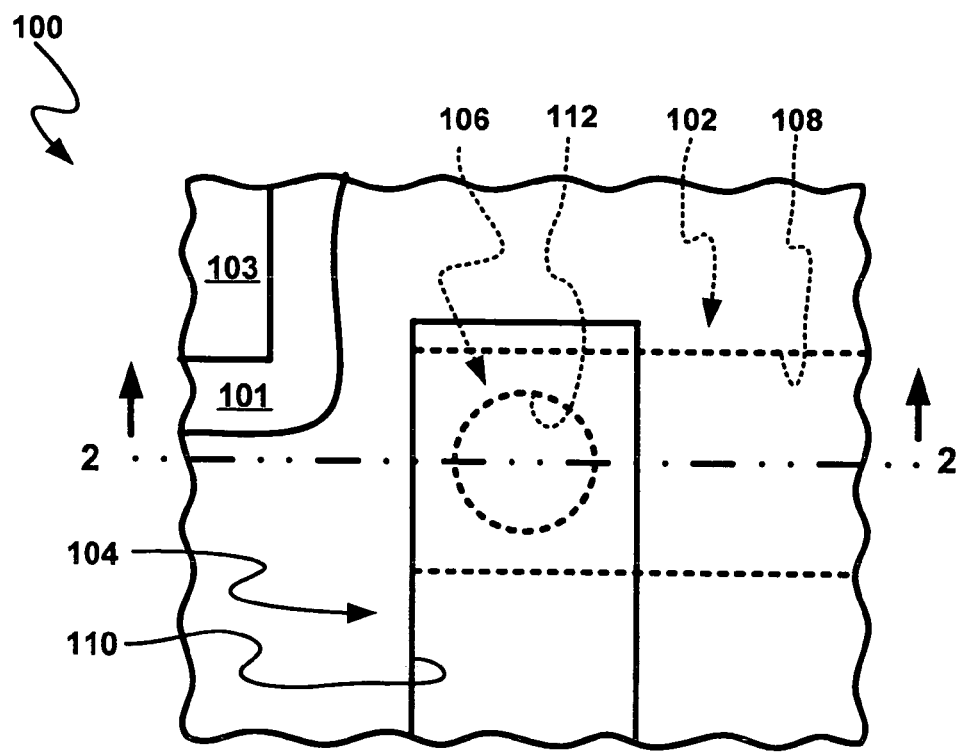
FIG. 1 is a plan view of aligned channels with a connecting via.

Referring now to FIG. 1, therein is shown a plan view of a semiconductor wafer 100 with a silicon semiconductor substrate 101 having semiconductor devices 103 formed thereon. Above the semiconductor substrate 101 in various dielectric layers are first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112. The semiconductor wafer 100 is shown without a capping layer, which will be discussed later.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
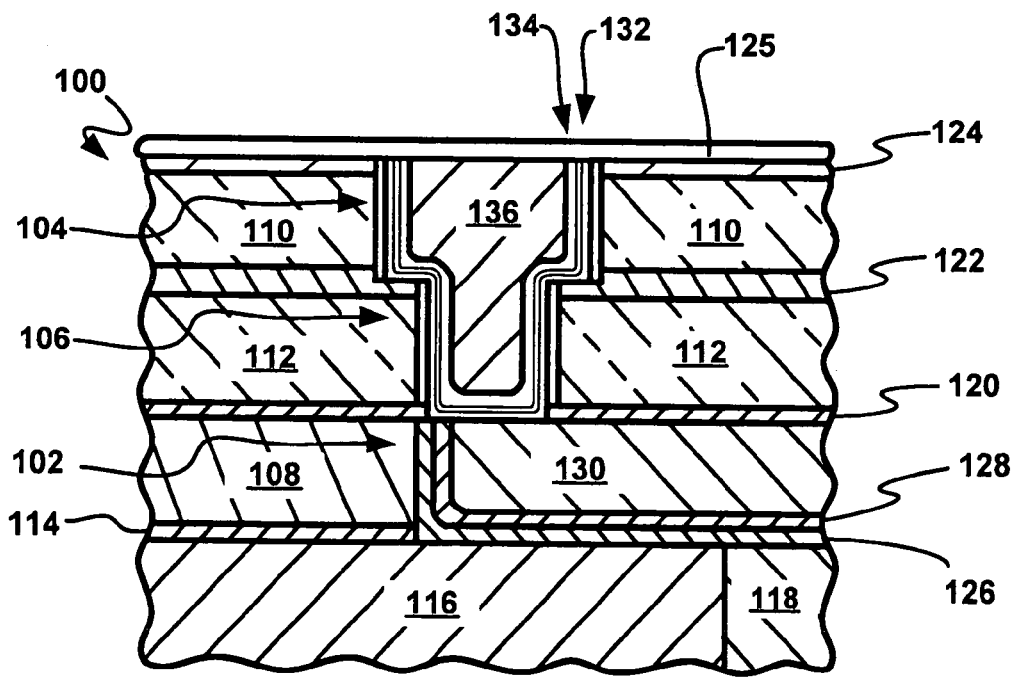
FIG. 2 is a cross-section of FIG. 1 along line 2—2 showing an interconnect in accordance with the present invention.

Referring now to FIG. 2, therein is shown a cross-section of FIG. 1 along line 2—2. A portion of a first channel 102 is disposed in a first channel stop layer 114 and is on a device dielectric layer 116, which is on the semiconductor substrate 101. Generally, metal contacts 118 are formed in the device dielectric layer 116 to connect to the semiconductor devices 103. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, a second via stop layer 124, and a capping layer 125.

The first channel 102 includes a barrier layer 126, which could optionally be a combined adhesion and barrier layer, and a seed layer 128 around a first conductor core 130. The first channel 102 could also be made according to a single damascene process in accordance with the present invention.

The second channel 104 and the via 106 include a barrier layer 132, according to the present invention, and a seed layer 134 around a second conductor core 136. The barrier layers 126 and 132 are used to prevent diffusion of the conductor materials into the adjacent areas of the semiconductor device. The seed layers 128 and 134 are optional depending on the conductor material deposition process. The seed layers 128 and 134 are used during electrochemical deposition of the conductor core material to form electrodes on which the conductor material of the conductor cores 130 and 136 is deposited. The seed layers 128 and 134 are of substantially the same conductor material as the first and second conductor cores 130 and 136 and become part of the respective first and second conductor cores 130 and 136 after the deposition.

With particular regard to conductor cores of conductor materials such as copper, the migration of copper atoms can lead to electrical short circuits, rendering the entire integrated circuit unusable. The barrier layers, used prior to the barrier layers 126 and 132 according to the present invention, have traditionally had high barrier resistance to limit the diffusion of copper atoms, but as the dimensions of semiconductor devices have shrunk, the proportional scaling of barrier layer dimensions in the via 106 led to an extremely thin (10–20 Angstroms thick) via sidewall.

In addition, the size reductions have caused the channels formed, such as the first and second channels 102 and 104, to be closer together which requires the use of low dielectric constant dielectric materials having dielectric constants under 3.9 and even ultra-low dielectric constant dielectric materials having dielectric constants under 2.8. Thus, the first channel dielectric layer 108, the via dielectric layer 112, and the second channel dielectric layer 110 are all of very low dielectric constant materials. These low dielectric constant materials are porous and, where the barrier depositions were formerly conformal to the conventional dielectric constant dielectric materials, the barrier layers were no longer conformal to these materials. It will be understood that the present invention contemplates low dielectric constant materials but is not restricted to such materials.

Both the thinness of the previous barrier layers and their non-conformal characteristic, have led to their ineffectiveness as diffusion barriers and also to the formation of voids in the seed layers and the conductor cores. The voids have also lead to reductions in electromigration (EM) resistance. In addition, these depositions have been found to damage the low dielectric constant materials as well as causing poor adhesion to seed layers.

Figure 3:
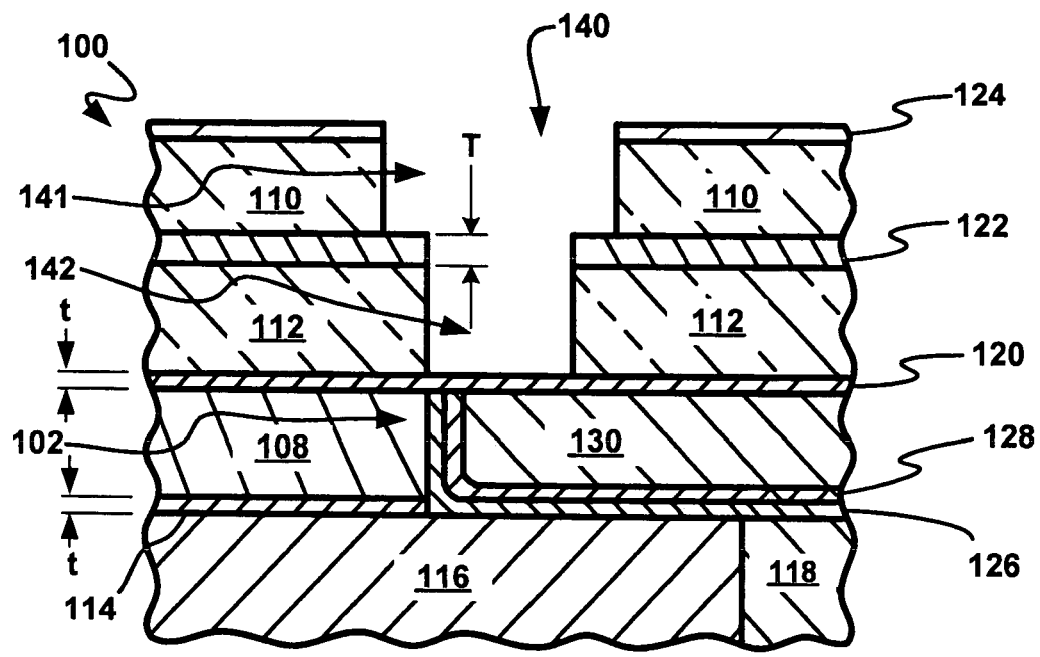
FIG. 3 shows a step in a dual damascene process according to the present invention.

Referring now to FIG. 3, therein is shown a step in a dual damascene process according to the present invention. It will be understood that the present invention is also applicable to a single damascene process, which is simpler than the dual damascene process shown.

The first channel 102 is disposed in the first channel stop layer 114 on the device dielectric layer 116, which is on the semiconductor substrate 101. A metal contact 118 is formed in the device dielectric layer 116 to connect to the semiconductor devices 103. The device dielectric layer 116, the first channel stop layer 114, the first channel dielectric layer 108, and the via stop layer 120 have all been formed. An opening has been made in the first channel dielectric layer 108 and lined successively with the barrier layer 126 and the seed layer 128. The first conductor core 130 fills the opening and the barrier layer 126, the seed layer 128, and the first conductor core 130 have been planarized to form the first channel 102 covered by the via stop layer 120.

The via dielectric layer 112 is deposited over the via stop layer 120. The second channel stop layer 122 is deposited over the via dielectric layer 112. It will be noted that in accordance with the present invention, the second channel stop layer 122 has a thickness "T" which is about twice the thickness "t" of the other stop layers, such as the via stop layer 120. This thickness "T" is used to maintain a thickness of at least "t" of the second channel stop layer 122 after etching of the via, as will later be explained.

Above the second channel stop layer 122 is the second channel dielectric layer 110 and the second via stop layer 124.

In FIG. 3, an etching process has been applied to form an interconnect opening 140 which includes a second channel opening 141 and a via opening 142. The second channel opening 141 is through the second via stop layer 124 and the second channel dielectric layer 110. The via opening 142 is through the second channel stop layer 122 and the via dielectric layer 112. It will be noted that the via opening 142 does not extend through the via stop layer 120 at this point.

Figure 4:
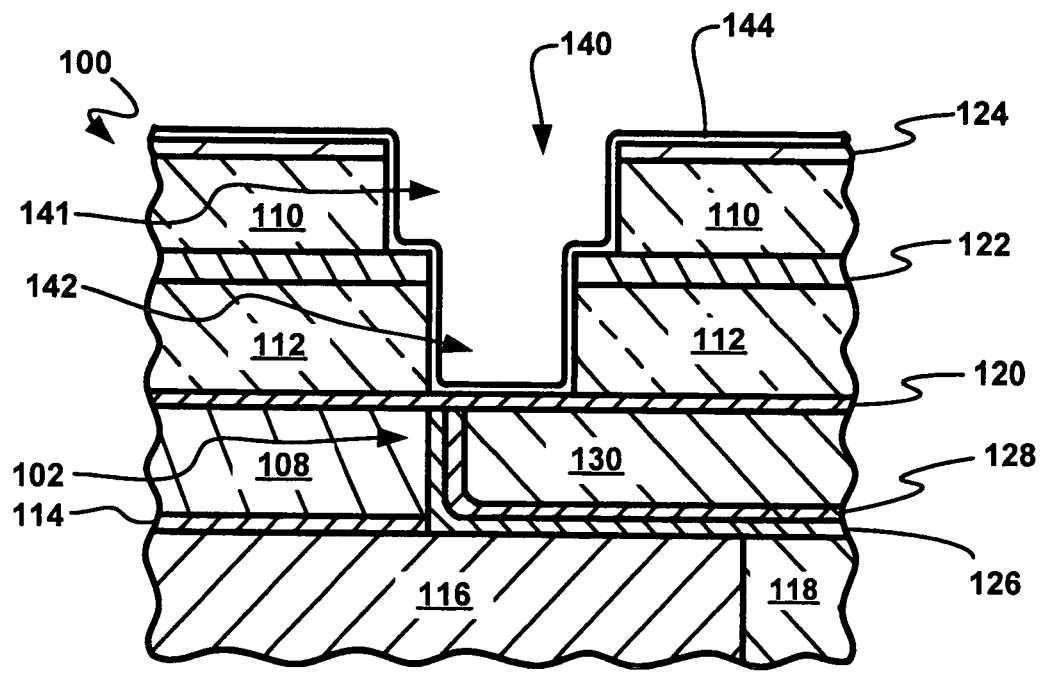
FIG. 4 is the structure of FIG. 3 after deposition of a conformal barrier liner

Referring now to FIG. 4, therein is shown the structure of FIG. 3 after deposition of a conformal barrier liner 144. The conformal barrier liner 144 is nonconductive and protects the via dielectric layer 112 and the second channel dielectric layer 110 from damage during conductor material deposition and prevents diffusion of the conductor material through to these layers during operation. Despite the porosity of the various dielectric layers, the conformal barrier liner 144 is conformal and has a constant thickness.

Figure 5:
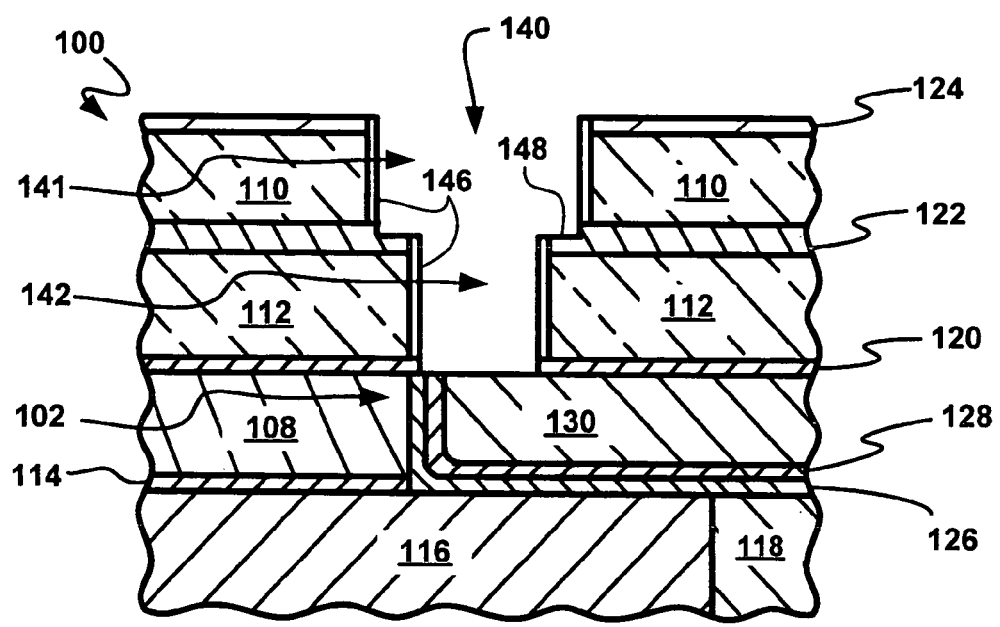
FIG. 5 is the structure of FIG. 4 after removal of the via stop layer in the via opening.

Referring now to FIG. 5, therein is shown the structure of FIG. 4 after removal of the via stop layer 120 in the via opening 142. An anisotropic etching process such as reactive ion etching is used to first remove the horizontal portions of the conformal barrier liner 144 such that remaining liner portions 146 of the constant thickness remain on the vertical side walls of the via dielectric layer 112 and the second channel dielectric layer 110. It will be noted that, after the etching process has removed the via stop layer 120 in the via opening 142, the thickness of the second channel stop layer 122 in the second channel opening 141 has been reduced by approximately the same thickness as the thickness "t" of the via stop layer 120 in a stepped region 148. The stepped region 148 acts as a barrier to prevent conductor diffusion into the via dielectric layer 112.

Figure 6:
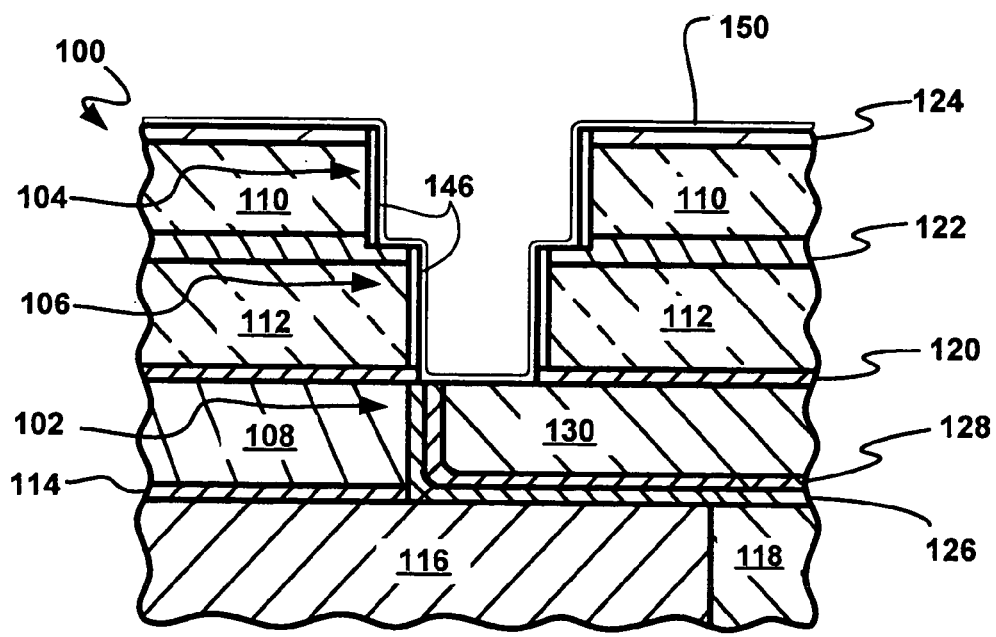
FIG. 6 is the structure of FIG. 5 after a sputter etch pre-clean process and a silane treatment.

Referring now to FIG. 6, therein is shown the structure of FIG. 5 after an optional sputter etch pre-clean process and a silane treatment by thermal decomposition or soft plasma activation. The silane treatment provides a silicon-rich surface 150 over the second via stop layer 124, the stepped region 148, the remaining liner portions 146, and the first channel 102.

Figure 7:
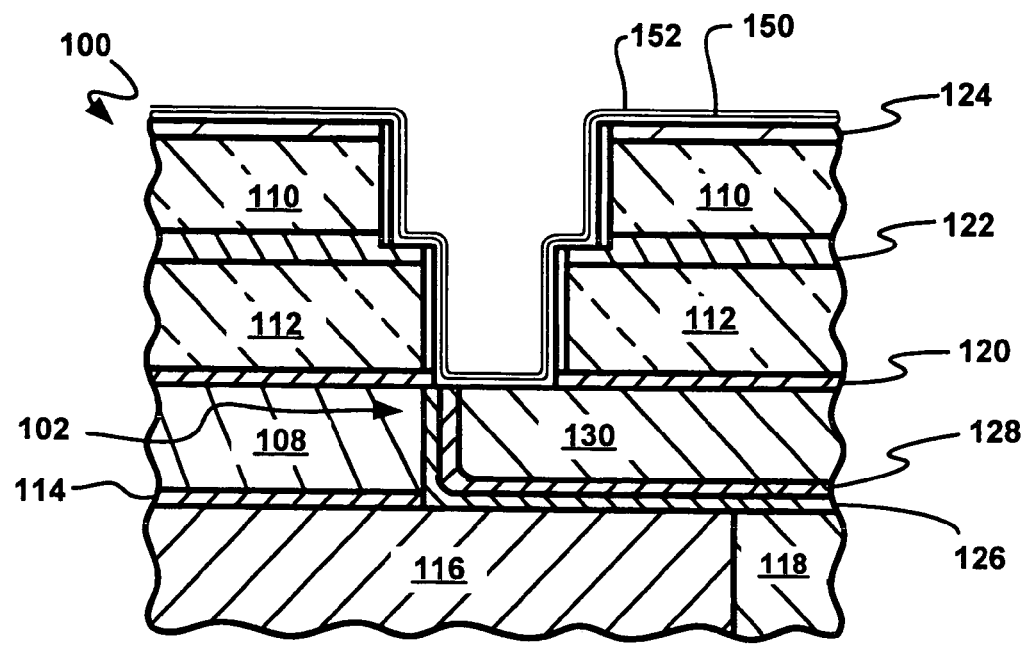
FIG. 7 is the structure of FIG. 6 after deposition of an ultra-thin conductor-wetting layer.

Referring now to FIG. 7, therein is shown the structure of FIG. 6 after treatment by deposition of an ultra-thin conductor-wetting layer 152. The wetting layer 152 may be deposited by a metal sputter deposition process to cover and bond to the silicon-rich surface 150.

In the present invention, it has been discovered that that the silane treatment for providing silicon-enriched surfaces 150 and/or the deposition of the wetting layer 152 will provide acceptable surfaces for seed layer deposition. Either or both the silicon-enrichment and wetting layer treatments appear to increase adhesion of the seed layer 134 to the remaining liner portions 146, the second via stop layer 124, the stepped region 148, the remaining portions of the conformal barrier liner 146, and the first channel 102 over the adhesion without such treatments.

Figure 8:
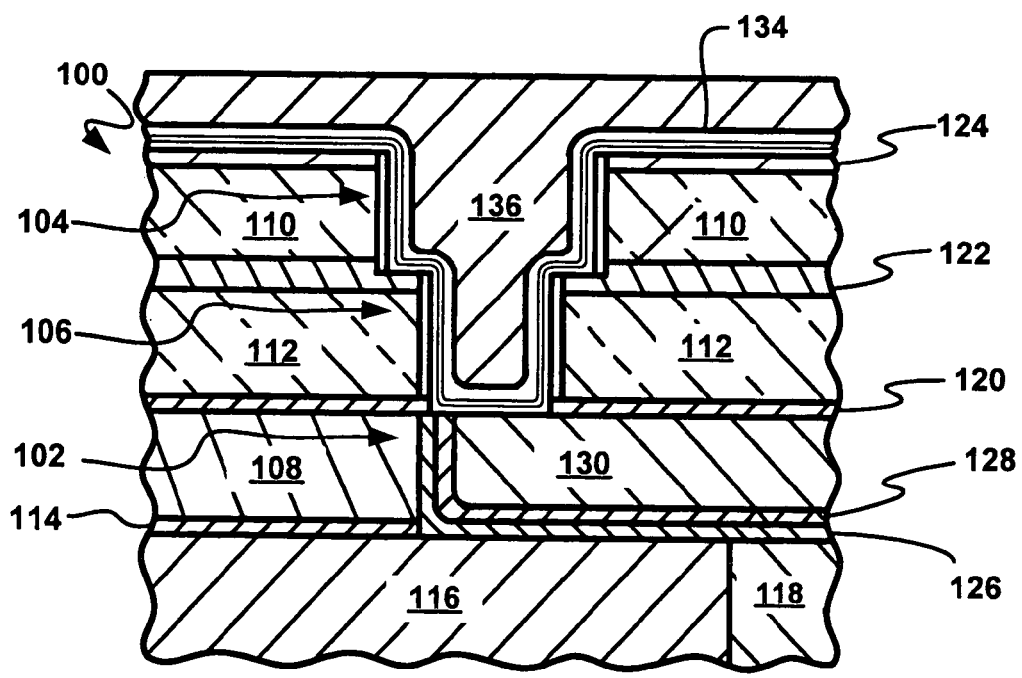
FIG. 8 is the structure of FIG. 7 after deposition of the seed layer and the conductor core.

Referring now to FIG. 8, therein is shown the structure of FIG. 7 after deposition of the seed layer 134 and the conductor core 136. The seed layer 134 is generally deposited by a chemical vapor deposition or physical vapor deposition process. This is followed by deposition of the conductor core 136 by electroplating, electroless plating, or chemical vapor deposition.

Figure 9:
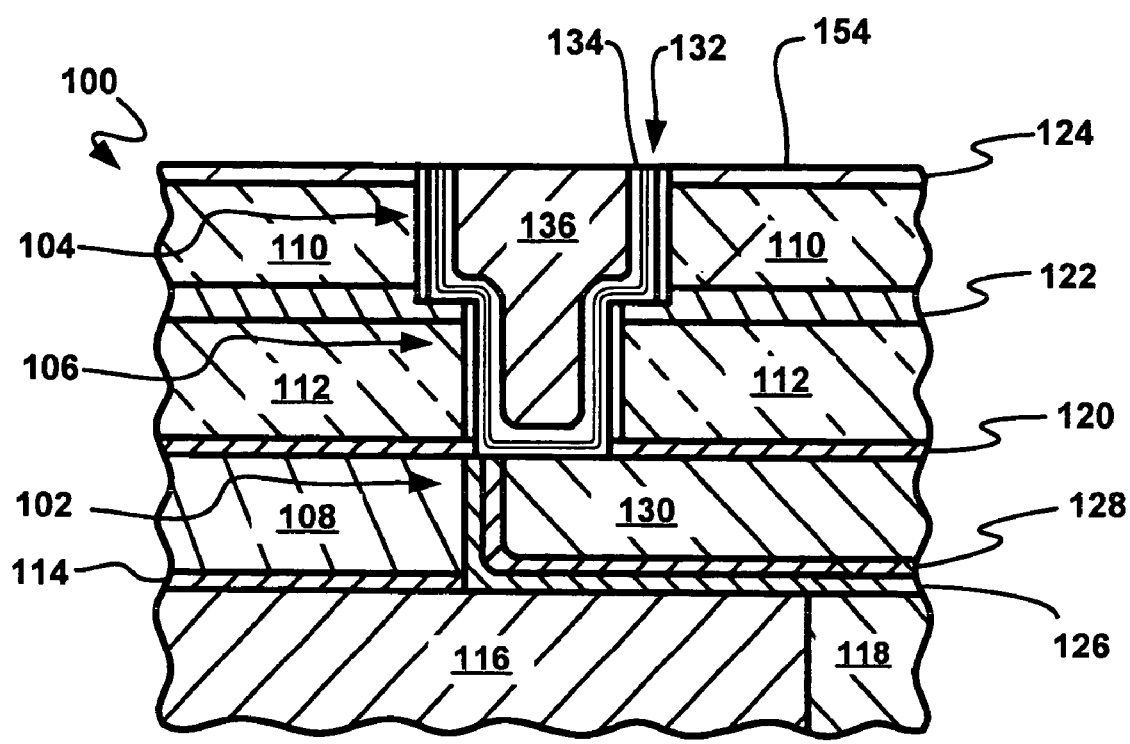
FIG. 9 is the structure of FIG. 8 after planarization.

Referring now to FIG. 9, therein is shown the structure of FIG. 8 after planarization by a process such as chemical-mechanical polishing (CMP). This leaves a planar surface 154.

Referring back to FIG. 1, therein is shown the structure of FIG. 9 after deposition of the capping layer 125 on the planar surface 154.

In various embodiments of the present invention, the conformal barrier liner 144 is used for all levels of interconnect and is a non-conductive barrier layer of materials such as a nitride (e.g., silicon nitride), BLok (available from Applied Materials Corporation of Santa Clara, Calif.), a carbide (e.g., silicon carbide), and an oxynitride (e.g., silicon oxynitride). It has been discovered that there is a critical range in thickness between 20 Angstroms and 70 Angstroms to maximize diffusion protection and minimize resistance of the channel and via.

In various embodiments of the present invention, the sputter etch pre-clean is performed by a process such as argon ion bombardment or reactive helium and dilute hydrogen pre-clean.

In various embodiment of the present invention, the silane ($SiH_4$) treatment using a process such as thermal decomposition or soft plasma activation forms a surface silicon-doped layer or layer with impurities of silicon on the low-k dielectric surface, which increase the interface between the liner and a subsequently deposited seed layer.

In various embodiments of the present invention, the wetting layer 152 is a refractory metal. It has been discovered that there is an "ultra-thin", critical range in thickness between 5 Angstroms and 30 Angstroms to maximize wetting action for the conductor material of the seed layer 134 and minimize resistance of the channel and via.

In various embodiments of the present invention, the seed layer is deposited by a process such as sputter deposition or chemical vapor deposition in a thickness range of 25 Angstroms to 300 Angstroms.

In various embodiments, the wetting layer 152 is of materials such as tantalum (Ta), titanium (Ti), tungsten (W), alloys thereof, and compounds thereof. The seed layers 134 (where used) are of materials such as copper (Cu), gold (Au), silver (Ag), compounds thereof and combinations thereof with one or more of the above elements. The conductor core 136, with or without seed layers, are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), SOP (trimethylsilil phosphate), etc. with dielectric constants below 3.9. The stop layers 114, 120, 122, and 124 (or thin insulation layers where these layers are not used as etch stop layers) and the capping layers are of materials such as silicon nitride ($Si_xN_x$) or silicon oxynitride (SiON).

While the invention has been described in conjunction with a specific best mode, it is to be understood that many alternatives, modifications, and variations, will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising;
   a substrate having a semiconductor device thereon;
   a first stop layer over the substrate having a portion open to the semiconductor device;
   a first dielectric layer over the first stop layer having an opening provided therein having sidewalls in the first dielectric layer;
   a first conformal barrier liner in the opening, the first conformal barrier liner having only vertical portions of a constant thickness on the sidewalls of the opening in the first dielectric layer, the vertical portions of the first conformal barrier liner on the sidewalls acting as a barrier to diffusion of conductor core material to the first dielectric layer;
   a treated area on the first conformal barrier liner and the first stop layer to increase adhesion properties thereof;
   a second stop layer over the first dielectric layer and having a stepped opening provided therein; and
   a first conductor core in the opening over the vertical portions of the first conformal barrier liner and the first stop layer, the first conductor core connected to the semiconductor device.

2. The integrated circuit as claimed in claim 1 including:
   a second dielectric layer over the second stop layer and having an opening provided therein having sidewalls;
   a third stop layer over the second dielectric layer and having an opening provided therein;
   a second conformal barrier liner in the opening in the second dielectric layer, the second conformal barrier liner having only vertical portions of a second constant thickness on the sidewalls of the openings in the second dielectric layer and the second dielectric layer;
   a treated area on the second conformal barrier liner and the second stop layer for increasing adhesion properties thereof; and
   the first conductor core in the opening over the vertical portions of the second conformal barrier liner and the second stop layer, the second conductor core connected to the first conductor core through the opening in the via stop layer.

3. The integrated circuit as claimed in claim 1 wherein the first stop layer over the substrate has a thickness "t" and the second stop layer has a thickness "T" of greater than about 2t.

4. The integrated circuit as claimed in claim 1 wherein the first conformal barrier liner has a region selected from a group consisting of silicon-enriched, wetting layer covered, and a combination thereof.

5. The integrated circuit as claimed in claim 1 wherein the first conformal barrier liner is a nonconductive barrier material selected from a group consisting of a nitride, a BLok, a carbide, an oxynitride, and a combination thereof.

6. The integrated circuit as claimed in claim 1 wherein the first conductor core is a material selected from a group consisting of copper, aluminum, gold, silver, compounds thereof, and combinations thereof.

7. The integrated circuit as claimed in claim 1 wherein the first dielectric layer comprises a low dielectric constant material.

8. An integrated circuit comprising;
a substrate having a semiconductor device thereon;
a device dielectric layer over the substrate;
a first channel stop layer over the substrate and the device dielectric layer having a portion open to the semiconductor device;
a first channel dielectric layer over the first channel stop layer having a first channel opening provided therein having sidewalls in the first channel dielectric layer;
a first conformal-barrier liner in the opening, the first conformal barrier liner having only vertical portions on the sidewalls of the opening in the first channel dielectric layer, the vertical portions of the first conformal barrier liner on the sidewalls acting as a barrier to diffusion of conductor core material to the first channel dielectric layer;
a treated area on the first conformal barrier liner and the first channel stop layer to increase adhesion properties thereof;
a via stop layer under the first channel dielectric layer and having a stepped opening provided therein; and
a first conductor core in the opening over the vertical portions of the first conformal barrier liner and the first channel stop layer, the first conductor core connected to the semiconductor device.

9. The integrated circuit as claimed in claim 8 including:
a via dielectric layer under the first channel stop layer and having a via opening provided therein having sidewalls;
the first channel stop layer having a stepped opening provided therein, a first portion of the stepped opening of the same size as the opening in the first channel dielectric layer and a second portion of the stepped opening of the same size as the opening in the via stop layer;
a second conformal barrier liner in the via opening, the second conformal barrier liner having only vertical portions on the sidewalls of the via opening, the vertical portion of the second conformal barrier liner on the sidewalls of the via opening acting as a barrier to diffusion of first conductor core material to the via dielectric layer;
a treated area on the second conformal barrier liner and the via stop layer to increase adhesion properties thereof; and
the first conductor core in the via opening over the vertical portions of the second conformal barrier liner and the first channel stop layer.

10. The integrated circuit as claimed in claim 8 wherein the via stop layer has a thickness "t" and the first channel stop layer has a thickness "T" of greater than about twice the thickness "t" distal from the stepped opening.

11. The integrated circuit as claimed in claim 8 wherein the first and second conformal barrier liners have regions selected from a group consisting of silicon-enriched, wetting layer covered, and a combination thereof.

12. The integrated circuit as claimed in claim 8 wherein the first conformal barrier liner comprises a nonconductive barrier material selected from a group consisting of a nitride, a BLok, a carbide, an oxynitride, and a combination thereof in a thickness between 20 Å and 70 Å.

13. The integrated circuit as claimed in claim 8 wherein the first channel dielectric layer comprises a porous low dielectric constant material having a dielectric constant under 3.9.

14. The integrated circuit as claimed in claim 8 wherein the first conductor core comprises a material selected from a group consisting of copper, aluminum, gold, silver, compounds thereof, and combinations thereof.

* * * * *